United States Patent
Lee

(10) Patent No.: US 6,448,659 B1
(45) Date of Patent: Sep. 10, 2002

(54) STACKED DIE DESIGN WITH SUPPORTING O-RING

(75) Inventor: Melissa Siow-Lui Lee, San Jose, CA (US)

(73) Assignee: Advanced Micro Devices, Inc., Sunnyvale, CA (US)

(*) Notice: Subject to any disclaimer, the term of this patent is extended or adjusted under 35 U.S.C. 154(b) by 0 days.

(21) Appl. No.: 09/559,405

(22) Filed: Apr. 26, 2000

(51) Int. Cl.[7] ................ H01L 23/48; H01L 23/52; H01L 29/40
(52) U.S. Cl. ............... 257/777; 257/723; 257/778; 257/784; 257/783; 257/730
(58) Field of Search ................ 257/787, 784, 257/777, 723; 438/107, 109, 110, 617, 112, 124, 127

(56) References Cited

U.S. PATENT DOCUMENTS

| | | | | |
|---|---|---|---|---|
| 5,489,804 A | * | 2/1996 | Pasch | 257/778 |
| 5,721,452 A | * | 2/1998 | Fogal et al. | 257/685 |
| 5,963,429 A | * | 10/1999 | Chen | 361/764 |
| 6,100,594 A | * | 8/2000 | Fukui et al. | 257/777 |
| 6,147,401 A | * | 11/2000 | Solberg | 257/723 |

* cited by examiner

Primary Examiner—Steven Loke
Assistant Examiner—Nitin Parekh

(57) ABSTRACT

A circuit assembly is formed with a lower die and an upper die, offset and stacked on the lower die. A resilient, e.g., elastomeric, O-ring is disposed about the periphery and adjacent side surfaces of the lower die to support the overhanging parts of the upper die. The supporting O-ring prevents the generation of stress inducing cracks in the upper die during wire bonding to bond pads on the overhanging parts of the upper die.

12 Claims, 4 Drawing Sheets

STACKED DIE DESIGN WITH SUPPORTING O-RING

RELATED APPLICATIONS

This application contains subject matter related to subject matter disclosed n copending U.S. application Ser. No. 09/504,895, filed on Feb. 16, 2000.

TECHNICAL FIELD

The present invention relates to semiconductor packaging technology. The present invention has particular applicability to semiconductor packages containing multiple semiconductor dies and to wire bonding stacked dies to substrates.

BACKGROUND ART

Ongoing advances in solid-state electronic devices impose continuous demands for integrated circuit devices with increased functionality, density, and performance. In response, multi-chip modules have evolved comprising a printed circuit board substrate to which a series of separate components are directly attached. Multi-chip devices advantageously increase circuit density with attendant improvements in signal propagation speed and overall device weight.

A conventional method of effecting electrical connection between a die and electric leads comprises wire bonding. Wire bonding techniques effect electrical interconnections among components in a discreet package by means of fine wire connectors welded to the individual components. Accordingly, a fine wire conductor or bond wire has one end connected to an electrical lead on the substrate surface and the other end connected to an electrical contact or bond pad on the die or chip.

In fabricating conventional multi-chip modules or multi-chip packages, semiconductor dies are superimposed, with the upper die typically overlapping at least one side surface of the underlying die. Overlapping portions of the upper die extending beyond or overhanging the side surfaces of the lower die contain bond pads on the upper surface to which bond wires are wire bonded.

For example, a conventional multi-die structure is schematically illustrated in FIGS. 1 and 2, wherein similar elements are denoted by similar reference numerals. Adverting to FIG. 1, substrate 10 has mounted thereon in a conventional manner first die 11 and second die 12 positioned above first die 1 such that overlapping parts 12A and 12B of second die 12 extend beyond the side surfaces of first die 11A and 11B, respectively. Bond pads 13 on the upper surface of first die 11 are electrically connected to conductors 16 on substrate 10 by wire bonds 15. Bond pads 14 on the upper surface of overlapping portions 12A and 12B of upper die 12 are connected to conductors 16 by wire bonds 15. Typically, the upper die 12 is positioned on first die 11 with a dielectric bonding material 20, such as an epoxy resin, therebetween, as shown in FIG. 2. Bond pad 14 on overlapping part 12A extending beyond the side surface 11A of underlying die 11 is wire bonded to a contact (not shown) on the main surface of substrate 10 with bond wire 15, as illustrated in FIG. 2. However, overlapping part 12A of upper die 12 is not supported on its underside. Accordingly, upon wire bonding bond wire 15 to bond pad 14 on the overlapping part 12A of upper die 12, cracking occurs in upper die 12, as indicated by arrow 21, with an attendant decrease in the durability of the resulting packaged semiconductor device and/or increase in rejection rate.

Accordingly, there exists a need for a semiconductor package comprising a circuit assembly with stacked, offset dies exhibiting improved reliability and structural integrity. There also exists a need for a method of manufacturing a packaged semiconductor device comprising a circuit assembly with stacked, offset dies with improved reliability and structural integrity.

SUMMARY OF THE INVENTION

An advantage of the present invention is a circuit assembly comprising offsetting stacked dies exhibiting improved reliability and structural integrity.

Another advantage of the present invention is a method of manufacturing a circuit assembly comprising stacked upper and lower dies without cracking of an overlapping portion of the upper die during wire bonding.

Additional advantages and features of the present invention will be set forth in part in the description which follows and in part will become apparent to those having ordinary skill in the art upon examination of the following or may be learned from the practice of the present invention. The advantages of the present invention may be realized and obtained as particularly pointed out in the appended claims.

According to the present invention, the foregoing and other advantages are achieved in part by a circuit assembly comprising: a substrate comprising a main surface; a first die having an upper surface, a lower surface and side surfaces, the lower surface of the first die positioned on the main surface of the substrate; a resilient O-ring positioned around and adjacent the side surfaces of the first die; a second die, having an upper surface and a lower surface, positioned such that part of the second die is supported by the first die and another part of the second die overlaps a side surface of the first die and is supported by the resilient O-ring; a bond pad on the upper surface of the second die on the overlapping part supported by the resilient O-ring; and a bond wire connected to a conductor on the main surface of the substrate and wire bonded to the bond pad.

Another advantage of the present invention is a method of manufacturing a circuit assembly, the method comprising: providing a substrate having a main surface; positioning a first die, having an upper surface, a lower surface and side surfaces, such that the lower surface of the first die is on the main surface of the substrate; disposing a resilient O-ring around and adjacent the side surfaces of the first die; positioning a second die, having an upper surface and a lower surface, such that part of the second die is supported by the first die and another part of the second die overlaps a side surface of the first die and is supported by the resilient O-ring, the upper surface of the second die having a bond pad on the overlapping part supported by the resilient O-ring; and wire bonding a bond wire to the bond pad.

Embodiments of the present invention comprise dispensing a bonding material, such as a nonconductive epoxy resin, on the upper surface of the first die prior to positioning the second die thereon. Embodiments of the present invention further include positioning the second die overlapping at least two opposing side surfaces of the first die such that the overlapping parts of the second die are supported by a resilient elastomeric O-ring. A plurality of bond wires are wire bonded to the bond pads on each of the overlapping parts of the second die, the bond wires being connected to bond fingers or conductors on the main surface of the substrate.

Additional advantages of the present invention will become readily apparent to those skilled in this art from the following detailed description, wherein only the preferred embodiment of the present invention is shown and described, simply by way of illustration of the best mode contemplated for carrying out the present invention. As will be realized, the present invention is capable of other and different embodiments and its several details are capable of modifications in various obvious respects, all without departing from the present invention. Accordingly, the drawings and descriptions are to be regarded as illustrative in nature, and not as restrictive.

DESCRIPTION OF THE PRESENT INVENTION

The present invention addresses and solves the problem of upper die cracking when wire bonding a bond wire to a portion of the upper die overlapping and, hence, not supported by an underlying die of a stacked die structure. In accordance with embodiments of the present invention, a resilient O-ring is positioned around and adjacent the side surfaces of the lower die. The resilient O-ring is selected with a size and resilience such that it provides sufficient support to overlapping parts of the upper die stacked on and offset from the lower die, to prevent cracking of the overlapping parts of the upper die during wire bonding.

Embodiments of the present invention further include dispensing a conventional dielectric bonding material, such as a conventional nonconductive epoxy resin employed in semiconductor packaging, e.g., QMI 536 obtainable from Quantum Materials, Inc. located in San Diego, Calif. . The resilient O-ring can be made from various dielectric materials having sufficient resilience to provide support to the overlapping parts of the upper die during wire bonding. Suitable materials for the O-ring include various elastomers.

In accordance with embodiments of the present invention, the upper die is positioned overlying the lower die such that part of the upper die is supported by the lower die and the dielectric material therebetween, and the other part of the upper die is supported by the resilient O-ring. The overlapping portions of the second die are supported by the resilient O-ring such that, during wire bonding to bond pads on the upper surface of the second die, sufficient support is provided to avoid cracking.

Embodiments of the present invention comprise positioning the upper die overlying the lower die such that the upper die overlaps and extends beyond two side surfaces of the lower die. The overlapping portions of the upper die typically contains a plurality of bond pads. Wire bonding is conducted to connect bond wires to the bond pads thereby providing electrical connection to bond fingers or conductors on the substrate surface. During wire bonding to any of the pad bonds on the upper surface of the overlapping parts of the upper die, sufficient support is provided by the underlying resilient O-ring to avoid the generation of crack inducing stresses.

It should be understood that except as set forth herein, the materials and bonding techniques employed in the various embodiments of the present invention are conventional and, hence, not set forth here and in detail in order not to obscure the present invention. For example, suitable conventional substrates for use in embodiments of the present invention typically comprise plated via holes therethrough and solder balls on the underside for bonding to a conventional printed circuit board.

Figure 1:
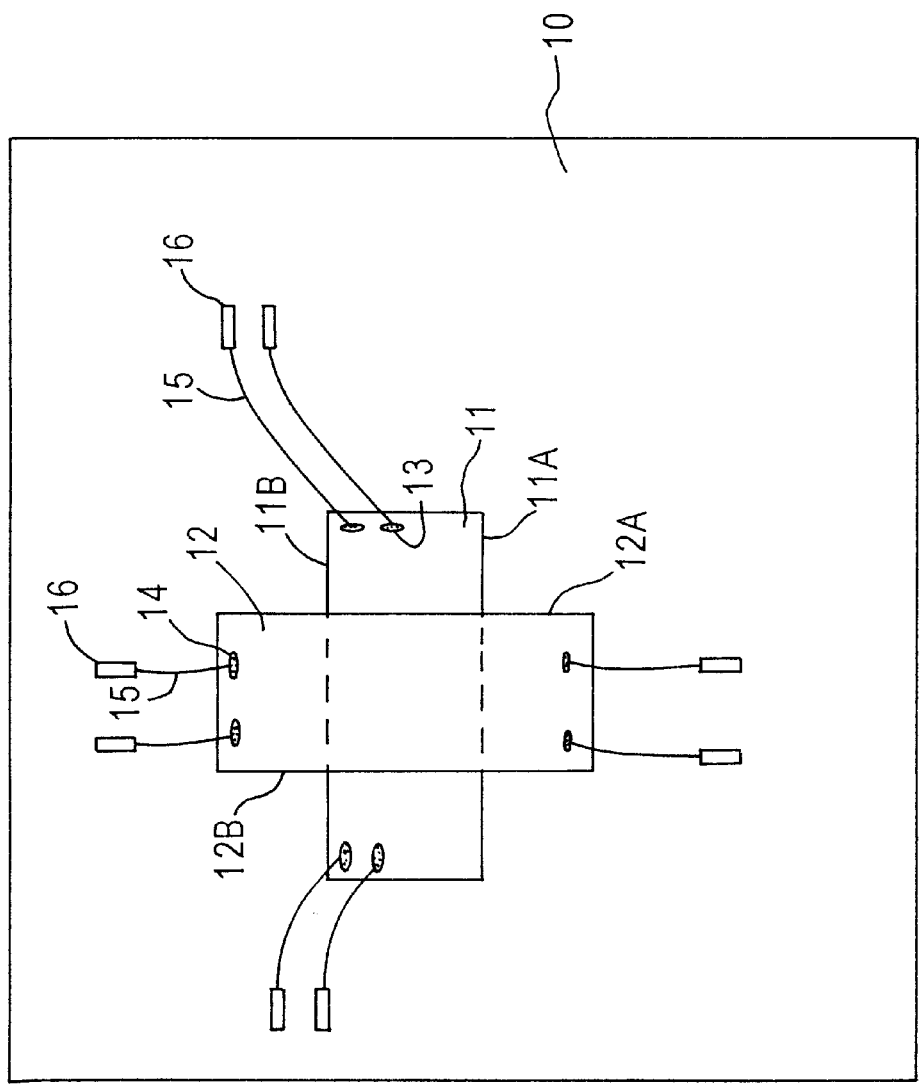
FIG. 1 schematically illustrates, in plan view, a conventional stacked die structure.
Figure 2:
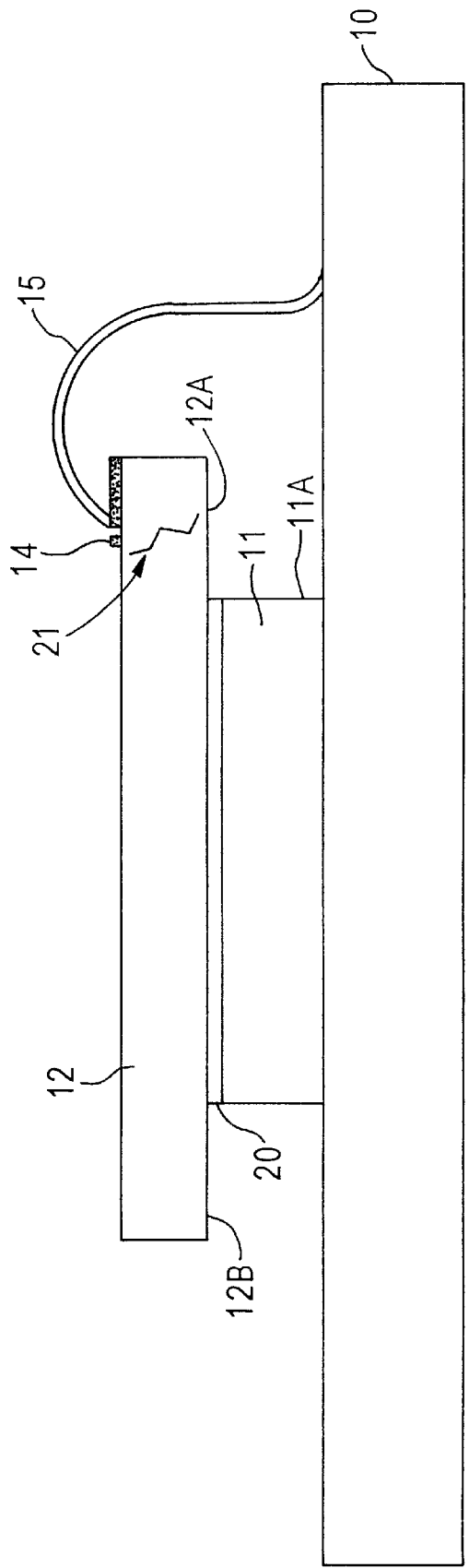
FIG. 2 schematically illustrates, in cross-sectional view, the conventional stacked die structure of FIG. 1.
Figure 3:
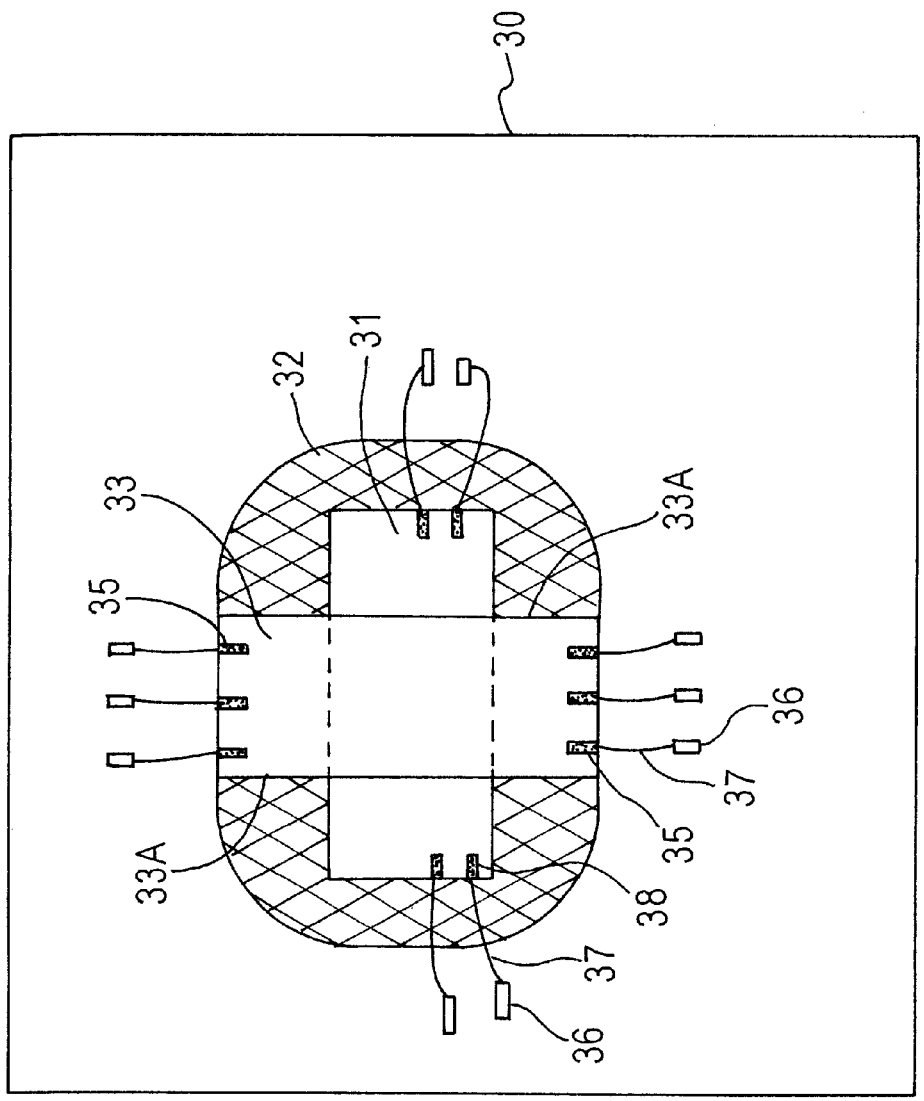
FIG. 3 schematically illustrates, in plan view, a stacked die structure in accordance with an embodiment of the present invention.
Figure 4:
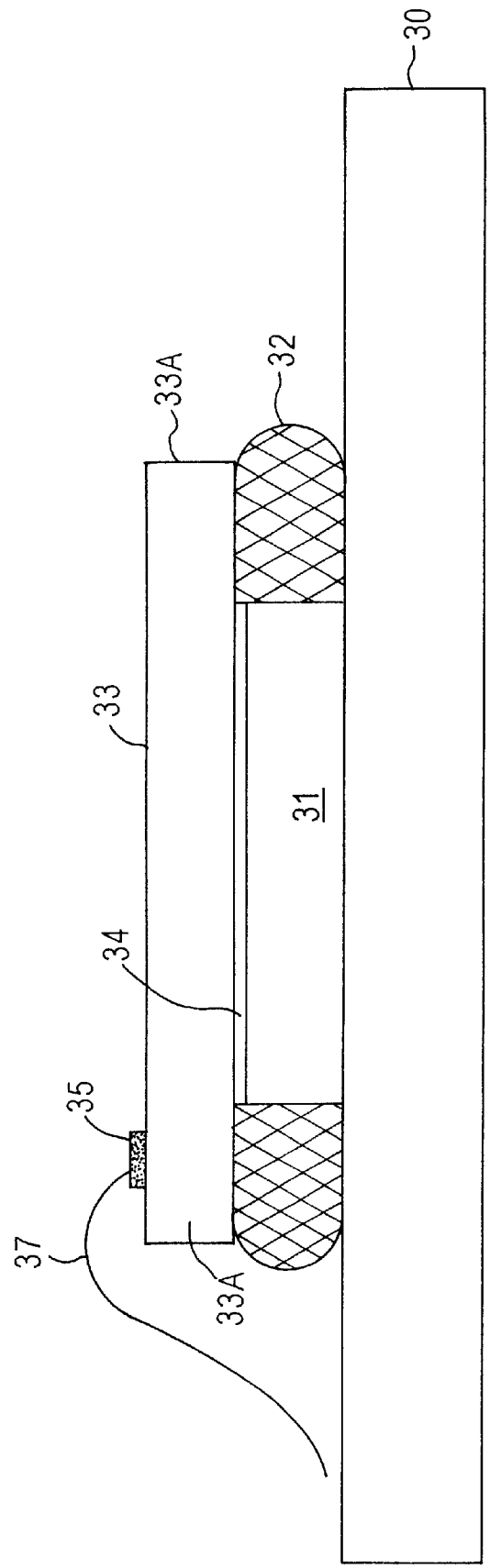
FIG. 4 schematically illustrates, in cross-sectional view, the stacked die structure of FIG. 3.

An embodiment of the present invention is schematically illustrated in FIGS. 3 and 4, wherein similar features are denoted by similar reference numerals. Adverting to FIGS. 3 and 4, first lower die 31 is positioned on the main surface of substrate 30. Embodiments of the present invention include dispensing a bonding material, such as a nonconductive epoxy resin 34, on the upper surface of first die 31, as illustrated in FIG. 4. A dielectric, resilient elastomeric O-ring 32, is then positioned around and adjacent the side surfaces of lower die 31. Second die 33 is then positioned overlying first die 31 such that portions 33A of upper die 33 overlap and, hence, extend beyond side surfaces of first lower die 31. The overlapping portions 33A of upper die 33 are supported by underlying resilient O-ring 32. Lower first die 31 contains bond pads 38 which are bonded to conductors 36 on substrate 30 by wire bonds 37. The overlapping portions 33A of second upper die 33 contain bond pads 35 which are bonded to conductors 36 on substrate 30 by wire bonds 37, one such bond pad 35 being shown in FIG. 4 for illustrative convenience. During wire bonding to connect bond wires 37 to bond pads 35 on overlapping portions 33A, sufficient support is provided by underlying resilient O-ring 32 to prevent cracking as occurs during conventional wire bonding techniques as illustrated in FIGS. 1 and 2.

The present invention is applicable to any of various types of integrated circuit packages. The present invention advantageously enables conservation of areal space on a printed circuit board, as by enabling the use of a single package containing two dies in lieu of two separate packages each containing a separate die.

Only the preferred embodiment of the present invention and an example of its versatility are shown and described in the present disclosure. It is to be understood that the present invention is capable of use in various other combinations and environments and is capable of changes or modifications within the scope of the inventive concept as expressed herein.

What is claimed is:

1. A circuit assembly comprising:
    a substrate having a main surface;
    a first die having an upper surface, a lower surface and side surfaces, the lower surface of the first die positioned on the main surface of the substrate;
    a resilient O-ring positioned around and adjacent the side surfaces of the first die;
    a second die, having an upper surface and a lower surface, positioned such that part of the second die is supported by the first die and another part of the second die overlaps a side surface of the first die and is supported by the resilient O-ring;
    a bond pad on the upper surface of the second die on the overlapping part supported by the resilient O-ring; and
    a bond wire connected to a conductor on the main surface of the substrate and wire bonded to the bond pads,
    wherein the O-ring is positioned below the bond pad to support the overlapping part upon which the bond pad is positioned.

2. The circuit assembly according to claim 1, further comprising a bonding material on the upper surface of the first die.

3. The circuit assembly according to claim 2, wherein the bonding material comprises a nonconductive epoxy resin.

4. The circuit assembly according to claim 1, wherein the resilient O-ring comprises an elastomeric material.

5. The circuit assembly according to claim 4, wherein the second die overlaps two opposing side surfaces of the first die such that each overlapping part of the second die is supported by the resilient O-ring.

6. The circuit assembly according to claim 5, comprising:

a plurality of bond pads on each of the overlapping parts of the second die; and a plurality of bond wires, each bond wire connected to a conductor on the main surface of the substrate and wire bonded to one of the plurality of bond pads.

7. A method of manufacturing a circuit assembly, the method providing a substrate having a main surface;

positioning a first die, having an upper surface, a lower surface and side surfaces, such that the lower surface of the first die is on the main surface of the substrate;

disposing a resilient O-ring around and adjacent the side surfaces of the first die;

positioning a second die, having an upper surface and a lower surface, such that part of the second die is supported by the first die and another part of the second die overlaps a side surface of the first die and is supported by the resilient O-ring, the upper surface of the second die having a bond pad on the overlapping part supported by the resilient O-ring; and wire bonding a bond wire to the bond pad.

8. The method according to claim 7, further comprising applying a bonding material on the upper surface of the first die.

9. The method according to claim 8, wherein the bonding material comprises a nonconductive epoxy resin.

10. The method according to claim 7, wherein the resilient O-ring comprises an elastomeric material.

11. The method according to claim 10, comprising positioning the second die overlapping two opposing side surfaces of the first die, such that each overlapping part of the second die is supported by the resilient O-ring.

12. The method according to claim 11, wherein the upper surface of the second die contains a plurality of bond pads on each of the overlapping parts, the method comprising wire bonding a bond wire to each bond pad.

* * * * *

UNITED STATES PATENT AND TRADEMARK OFFICE
CERTIFICATE OF CORRECTION

PATENT NO.   : 6,448,659 B1
DATED        : September 10, 2002
INVENTOR(S)  : Melissa Siow-Lui Lee It is certified that error appears in the above-identified patent and that said Letters Patent is hereby corrected as shown below:

<u>Column 4,</u>
Line 60, change "bond pads" to -- bond pad --;

<u>Column 5,</u>
Line 16, after "method", insert -- comprising: --.

Signed and Sealed this

Twenty-seventh Day of May, 2003

JAMES E. ROGAN
*Director of the United States Patent and Trademark Office*